United States Patent [19]

Becker

[11] Patent Number: 5,457,088
[45] Date of Patent: Oct. 10, 1995

[54] PROCESS FOR THE PREPARATION OF A SEMICONDUCTOR FROM AN OXALATE

[75] Inventor: Winfried Becker, Kelkheim(Taunus), Germany

[73] Assignee: Hoechst Aktiengesellschaft, Frankfurt, Germany

[21] Appl. No.: 579,480

[22] Filed: Sep. 7, 1990

[30] Foreign Application Priority Data

Sep. 9, 1989 [DE] Germany .................. 39 30 113.3

[51] Int. Cl.⁶ .................. C04B 35/505; C04B 35/45
[52] U.S. Cl. .................. 505/441; 505/738; 501/152; 501/123
[58] Field of Search ............... 505/1, 801, 810, 505/815, 738, 441; 501/152, 123

[56] References Cited

U.S. PATENT DOCUMENTS

| | | | |
|---|---|---|---|
| 4,804,649 | 2/1989 | Sherif | 505/1 |
| 4,898,851 | 2/1990 | Michel | 505/1 |
| 4,923,849 | 5/1990 | Sherif | 505/1 |
| 4,956,340 | 9/1990 | Kimura et al. | 505/1 |

FOREIGN PATENT DOCUMENTS

| | | |
|---|---|---|
| 287064 | 10/1988 | European Pat. Off. . |
| 303249 | 2/1989 | European Pat. Off. . |
| 313148 | 4/1989 | European Pat. Off. . |

OTHER PUBLICATIONS

"Synthesis of Superconductive Oxides by Vacuum Calcination Method" Uno et al.—Jap. J. of App. Phys. pp. L1003–L1006 vol. 27, No. 6, Jun. 1988.
"Effect of Residual Water on Superconductivity in $(La_{1-x}Sr_x)_2CuO_{4-8}$" Kisnio et al. Jap. J. of Applied Phys. vol. 26 #4 Apr. 1987 pp. L466–L467.
Journal of the American Ceramic Society, vol. 72, No. 4, Apr. 1989, pp. 696–698, K. W. Lang: "Formation of Yttrium Barium Cuprate Powder at Low Temperatures".

*Primary Examiner*—Mark L. Bell
*Assistant Examiner*—C. M. Bonner
*Attorney, Agent, or Firm*—Curtis, Morris & Safford

[57] ABSTRACT

To prepare a phase-pure, ceramic oxide superconductor which contains, in addition to copper, at least one alkaline earth metal from the group comprising Ba, Sr and Ca, and at least one metal from the group comprising Y, La, Tl, Pb and the rare earths, for example of $YBa_2Cu_3O_{7-x}$, a solution is prepared which contains the metal components in the atomic ratios of the superconductor. The metals are precipitated as oxalates by combining this solution with an oxalic acid solution, the mixture of the oxalates is separated off, dried and decomposed to form the oxides, and the latter are subsequently sintered at temperatures of from 700° to 900° C. in the presence of oxygen to form the superconductor. In this process, the heating of the metal oxalates and the oxides formed therefrom up to 700° C. is carried out at a maximum oxygen partial pressure of 50 mbar, preferably in an inert gas.

2 Claims, No Drawings

PROCESS FOR THE PREPARATION OF A SEMICONDUCTOR FROM AN OXALATE

The present invention relates to a process for the preparation of a phase-pure, copper-containing, ceramic oxide superconductor which contains, in addition to copper, at least one alkaline earth metal (Ba, Sr or Ca) and at least one metal selected from the group comprising Y, La, Tl, Pb and the rare earths, by quantitative coprecipitation of the metal oxalates from appropriately adjusted solutions, and the controlled decomposition thereof.

The preparation of $YBa_2Cu_3O_{7-x}$ ceramics was described for the first time in Physical Review Letters, Vol. 58 (1987), page 908. In this process, the starting compounds $Y_2O_3$, $BaCO_3$ and $CuO$ are mixed thoroughly. The mixture is pressed, sintered for several hours at 950° C. and finally slowly cooled to room temperature in a stream of oxygen. It was subsequently found that the sintering temperature, cooling rate and gas atmosphere have a considerable effect on the physical properties of the material obtained, in particular those which are responsible for the superconductivity.

In spite of considerable experimental effort to optimize the preparation conditions, the situation is still unsatisfactory with respect to obtaining phase-pure powders or ceramics. The most frequent subphases identified have been $BaCuO_2$, $Y_2BaCuO_5$ and $CuO$ for $YBa_2Cu_3O_{7-x}$. Similar problems also exist in the preparation of other copper-containing, ceramic oxide superconductors.

In order to prevent local inhomogeneities, which are possibly not eliminated sufficiently by sintering the oxides, attempts have been made to obtain metal-containing starting materials by coprecipitation.

EP 303 249 discloses a process for the preparation of $YBa_2Cu_3O_x$ superconductors in which an aqueous solution containing the nitrates of Y, Ba and Cu in the Y:Ba:Cu atomic ratio of 1:2:3 is precipitated using oxalate. The oxalate is isolated and baked first at 700° C. at an oxygen partial pressure of 0.01 mmHg and then, as moldings, at 850° C. or 900° C. in oxygen. During this procedure, problems can occur with coprecipitates precipitated from aqueous solution, due to the solubilities of the precipitated salts in water, which generally vary (Solid State Communications, Vol. 64 (1987), page 881).

According to U.S. Pat. No. 4,804,649, a basic oxalate is obtained by coprecipitation from an aqueous solution containing salts of Y, Ba and Cu using an alkaline oxalate solution.

It has been observed that, on decomposition of oxalates in the presence of oxygen, $BaCO_3$ is also formed, which only reaches a dissociation pressure of 1 bar at above 1400° C. This hinders the formation of $YBa_2Cu_3O_{7-x}$ since $YBa_2Cu_3O_6$ decomposes noticeably above only 950° C. For this reason, long ignition times must be accepted in the preparation of the superconductor.

The object was therefore to carry out the thermal decomposition of the oxalate to form the oxides in such a manner that the purest possible oxide mixture with high sintering activity is produced, with which the further reaction to form the superconductor, in particular to form $YBa_2Cu_3O_{7-x}$, takes place easily.

A process has now been found for the preparation of a copper-containing, ceramic oxide superconductor which contains, in addition to copper, at least one alkaline earth metal and at least one metal selected from the group comprising Y, Tl, Pb, La and the rare earths, in which a solution is prepared which contains, in the form of soluble salts, the metal components of the superconductor in the calculated amounts, the metals are precipitated as oxalates by combining this solution with an oxalic acid solution, the mixture of the oxalates is separated off, dried and converted into the oxides by thermal decomposition, and the latter are subsequently sintered at 700°–950° C. in the presence of oxygen and converted into the superconductor. The process comprises carrying out the heating of the metal oxalates and of the oxides formed therefrom at up to 700° C. at a maximum oxygen partial pressure of 50 mbar, in particular 5–50 mbar. Besides oxygen, an inert gas, such as, for example, argon or nitrogen, can be employed here. The decisive factor is the partial pressure of the oxygen, not the absolute pressure. An absolute pressure of 0.5–2 bar, in particular 0.8–1.2 bar, preferably atmospheric pressure, is preferred.

One preferred process for the preparation of a phase-pure, copper-containing, ceramic oxide superconductor which contains, in addition to copper, at least one alkaline earth metal selected from the group consisting of Ba, Sr, and Ca, and at least one metal selected from the group consisting of Y, La, Tl, Pb and rare earths, is a process in which a solution is prepared which contains the soluble salts of these metals in the atomic ratios of the superconductor, the metals are precipitated as oxalates by combining this solution with an oxalic acid solution, the mixture of the oxalates is separated off, dried and decomposed to form the oxides, and the latter are subsequently sintered at temperature of from 700° to 900° C. in the presence of oxygen and converted into the superconductor, which comprises carrying out the heating of the metal oxalate at 200° to 400° C. in a gas atmosphere which has an $O_2$ partial pressure of from 0 to 5 mbar, and carrying out the heating of the oxide-containing powder formed therefrom up to 700° C. in a gas atmosphere having an oxygen partial pressure from 1 to 50 mbar.

On subsequent heating above 700° C. in the presence of $O_2$, traces of free carbon or free metals are easily converted into the oxides without $BaCO_2$ being formed.

Under these conditions, no $BaCO_2$ forms. If the $O_2$ partial pressure drops below 5 mbar, free carbon occurs. It is then advantageous to carry out the further heating up to 700° C. in a gas mixture having an oxygen partial pressure of 1–50mbar, in particular 5–50mbar. The sintering is preferably carried out under pure oxygen.

The $YBa_2Cu_3O_{7-x}$ initially formed is converted into $YBa_2Cu_3O_{7-x}$ at low temperature on subsequent thermal treatment in the presence of $O_2$.

The sintering to form $YBa_2Cu_3O_6$ powder can preferably be carried out at 800°–900° C., in particular at 800°–850° C., since the absence of $BaCO_3$ allows the reaction temperature to be reduced. This results in a decrease in interfering foreign phases and in finer powders.

Pressed moldings made from the powder obtained by decomposition of oxalates can be sintered at 850°–900° C. for at least 12 hours in a stream of oxygen.

Both the powder treated with oxygen at above 700° C. and a molding produced therefrom are superconducting on conditioning in an oxygen atmosphere at 400°–500° C., preferably for at least 5 hours.

Similar results are obtained if Y is fully or partially replaced by La, Tl, Pb or a rare earth metal and if barium is fully or partially replaced by strontium or calcium.

The process indicated is particularly suitable for the preparation of ceramic oxide superconductors containing no bismuth, preferably for the preparation of $YBa_2Cu_3O_z$, but also for $LaBa_2Cu_3O_z$, $LnBa_2Cu_3O_z$ (where Ln is a rare earth element), $Y_{1-x}Ca_xBa_2Cu_3O_7$, $YSr_2Cu_3O_7$, $La_{1+x}Ba_{2-x}Cu_3O_7$, $La_{2-x}Sr_xCuO_4$, $Tl_2Ba_2CaCuO_8$, $Tl_2Ba_2Ca_2Cu_3O_{10}$, $Tl_2Ba_{2-x}Sr_xCaCu_2O_8$, $TlBa_2Cu_3O_9$ and $Pb_2Sr_2Ca_{1-x}Y_xCu_3O_8$.

To obtain the oxalate, it is possible on the one hand to employ a solution of the metal salts in a water-miscible organic solvent, for example a solution of $YCl_3$, $CuCl_2$ and $Ba(ClO_4)_2$ in ethanol, and to combine this solution with an alcoholic or aqueous oxalic acid solution. However, it is also possible to employ an aqueous solution containing the metal cations, and, preferably at elevated temperature, to mix this solution with a solution of oxalic acid, water or a water-miscible organic solvent, and thus to precipitate the oxalates. Examples of suitable salts are, depending on solubility, the chlorides, sulfates, citrates or nitrates. The oxalate of Tl(1) is also sparingly soluble. The oxalates are less soluble in the water-miscible organic solvents, for example alcohol, methanol and acetone, than in water.

The pale blue precipitate produced is first washed with cold water or a water-miscible organic solvent, for example ethanol, and dried. The thermal decomposition of the oxalate at temperatures of from 200° to 400° C. and the subsequent heating of the oxides formed up to 700° C. are carried out at a maximum oxygen partial pressure of 50 mbar, in particular 5 to 50 mbar. The subsequent reaction to give the superconductor, with sintering in the case of pressed moldings, is carried out at 800°–900° C., preferably at 800°–850° C., in a stream of oxygen. The sintering of a press molding of $YBa_2Cu_3O_7$ commences at 800° C. according to dilatometric studies, i.e. around 100K lower than in the case of conventional samples.

The superconductor powders synthesized by the process indicated were identified as phase-pure using X-ray powder methods and analytical content determination using a microprobe. They have very fine grains. Their primary particle size is below 1 μm.

EXAMPLE 22.5 mmol of $Y(NO_3)_3.5H_2O$, 45 mmol of $Ba(NO_3)_2$ and 67.5 mmol of $Cu(NO_3)_2.3H_2O$ were dissolved in 200 ml of water, and the solution was atomized for about 2.5 hours using ultrasound. To this end, the apparatus described in German Offenlegungsschrift 3,632,396 was used.

A vigorously stirred solution of 293 mmol of oxalic acid in 1 l of ethanol in a beaker was positioned at a distance of about 5 cm below the ultrasound atomizer. When the atomization was complete, the resultant precipitate was separated from the ethanol by centrifugation and dried at 110° C. for 4 hours in a drying oven. According to chemical analysis, the atomic ratio was 0.99 Y:1.99 Ba: 3 Cu, which agrees with the calculated composition taking into account the analytical inaccuracy.

For calcination and conversion of the oxides into the superconductor, the dried powder was heated to 400° C. over the course of 10 hours in an atmosphere of 20 mbar of $O_2$ and 980 mbar of $N_2$, kept at 400° C. for 5 hours, then heated to 900° C. over the course of 4 hours and kept at this temperature for 6 hours in pure $O_2$. The material was subsequently cooled to room temperature over the course of 6 hours in pure $O_2$.

The powder was subsequently conditioned for a further 10 hours at 400° C. under an oxygen atmosphere in order to bring the oxygen content to the level necessary for superconduction. The transition temperature is 92K.

The power was pressed to form a tablet, which was heated to 900° C. over the course of 4 hours in oxygen, kept at 900° C. for 6 hours, cooled to 400° C. over the course of 6 hours, kept at 400° C. for a further 10 hours and then removed from the oven. The tablets exhibited a critical current density of 501.5 $A/cm^2$. According to X-ray studies, the comminuted tablets comprise phase-pure $YBa_2Cu_3O_{7-x}$.

I claim:

1. A process for the preparation of a phase-pure, copper-containing, ceramic oxide superconductor which contains, in addition to copper, at least one alkaline earth metal selected from the group consisting of Ba, Sr, and Ca, and at least one metal selected from the group consisting of Y, La, Tl, Pb and the rare earths, in which a solution is prepared which contains the soluble salts of these metals in the atomic ratios of the superconductor, the metals are precipitated as oxalates by combining this solution with an oxalic acid solution, the mixture of the oxalates is separated off, dried and decomposed to form the oxides, and the latter are subsequently sintered at temperatures of from 700° to 900° C. in the presence of oxygen and converted into the superconductor, which comprises carrying out the heating of the metal oxalate at 200° to 400° C. in a gas atmosphere which has an $O_2$ partial pressure of from 0 to 5 mbar, and carrying out the heating of the oxide-containing powder formed therefrom up to 700° C. in a gas atmosphere having an oxygen partial pressure from 1 to 50 mbar.

2. The process as claimed in claim 1, wherein a solution is employed which contains the metal components Y:Ba:Cu as cations in an atomic ratio of 1:2:3.

* * * * *